(12) United States Patent
Lee

(10) Patent No.: US 12,284,815 B2
(45) Date of Patent: Apr. 22, 2025

(54) MULTILAYER-TYPE ON-CHIP INDUCTOR STRUCTURE

(71) Applicant: VIA LABS, INC., New Taipei (TW)

(72) Inventor: Sheng-Yuan Lee, New Taipei (TW)

(73) Assignee: VIA LABS, INC., New Taipei (TW)

( * ) Notice: Subject to any disclaimer, the term of this patent is extended or adjusted under 35 U.S.C. 154(b) by 634 days.

(21) Appl. No.: 17/690,580

(22) Filed: Mar. 9, 2022

(65) Prior Publication Data

US 2023/0207612 A1 Jun. 29, 2023

(30) Foreign Application Priority Data

Dec. 29, 2021 (TW) .................................. 110149356

(51) Int. Cl.
*H01L 23/522* (2006.01)
*H01F 17/00* (2006.01)
*H10D 1/20* (2025.01)

(52) U.S. Cl.
CPC ........... *H10D 1/20* (2025.01); *H01F 17/0013* (2013.01); *H01L 23/5227* (2013.01); *H01F 2017/0086* (2013.01)

(58) Field of Classification Search
CPC .. H10D 1/20; H10D 1/80; H10F 27/32; H10F 27/323; H10F 27/28; H10F 27/2804; H10F 2027/2809; H10F 17/00; H10F 17/0013; H10F 2017/0073; H10F 2017/0086; H01L 23/64; H01L 23/645; H01L 23/522; H01L 23/528; H01L 23/5227; H01L 23/5226; H01L 23/5283
USPC .......................................................... 257/531
See application file for complete search history.

(56) References Cited

U.S. PATENT DOCUMENTS

2005/0104705 A1* 5/2005 Mukherjee .......... H01F 17/0013
336/200
2017/0287623 A1* 10/2017 Valentin .................. H01F 27/29

* cited by examiner

*Primary Examiner* — Chuong A Luu
(74) *Attorney, Agent, or Firm* — McClure, Qualey & Rodack, LLP

(57) ABSTRACT

A multilayer-type on-chip inductor includes a first winding portion arranged in an inter-metal dielectric (IMD) layer, which includes first and second semi-circular stacking layers arranged from inside to outside and in concentricity. A second winding portion includes third and fourth semi-circular stacking layers arranged symmetrically with the first semi-circular stacking layer and the second semi-circular stacking layer, respectively, with respect to a symmetry axis. A conductive branch layer is disposed in an insulating redistribution layer over the IMD layer. The first, second, third, and fourth semi-circular stacking layers each include an uppermost trace layer and a next uppermost trace layer vertically stacked under the uppermost trace layer.

10 Claims, 8 Drawing Sheets

MULTILAYER-TYPE ON-CHIP INDUCTOR STRUCTURE

CROSS REFERENCE TO RELATED APPLICATIONS

This application claims priority of Taiwan Patent Application No. 110149356, filed on Dec. 29, 2021, and entitled "MULTILAYER-TYPE ON-CHIP INDUCTOR STRUCTURE", the entirety of which is incorporated by reference herein.

BACKGROUND OF THE INVENTION

Field of the Invention

The invention relates to a semiconductor structure, and in particular to a T-coil multilayer-type on-chip inductor structure.

Description of the Related Art

Many digital/analog devices and circuits have been successfully applied to semiconductor integrated circuits. Such devices may include passive components, such as resistors, capacitors, or inductors. Typically, a semiconductor integrated circuit includes a silicon substrate. One or more dielectric layers are disposed on the substrate, with one or more metal layers disposed in the dielectric layers. The metal layers may be employed to form on-chip elements, such as T-coil type on-chip inductors, using current semiconductor process technologies. T-coil type on-chip inductors have two inductor structures and a branch structure coupled between the windings of the two inductor structures, making the on-chip inductor form a three-terminal device with two input/output ports and a center tap (e.g., T-coil device)

With the rapid development of communication systems, a system on chip (SOC) typically includes radio frequency (RF) circuits and digital or baseband circuits. Since the RF circuits in the design rule of the SOC include thick traces with a relatively high manufacturing cost, the chip design for fabrication typically employs a digital or baseband circuit process with a relatively low manufacturing cost. However, compared to the RF circuits in the design rule of the SOC, digital or baseband circuits in the design rule of the SOC employ thinner inductor traces, resulting in a reduced quality factor (Q value).

Since the performance of integrated circuit devices is based on the Q value of the on-chip inductors, there is a need to develop an on-chip inductor structure with an increased quality factor (Q value).

BRIEF SUMMARY OF THE INVENTION

In some embodiments, a multilayer-type on-chip inductor structure is provided. The multilayer-type on-chip inductor structure includes a first winding portion disposed in an inter-metal dielectric (IMD) layer and including a first semi-circular stacking layer and a semi-circular stacking layer arranged from inside to outside and in concentricity, and a first input/output conductive portion disposed on the outside of the second semi-circular stacking layer. The multilayer-type on-chip inductor structure also includes a second winding portion, disposed in the inter-metal dielectric (IMD) layer and including a third semi-circular stacking layer and a fourth semi-circular stacking layer arranged symmetrically with the first semi-circular stacking layer and the second semi-circular stacking layer, respectively, with respect to a symmetry axis, and a second input/output conductive portion disposed on the outside of the fourth semi-circular stacking layer. The multilayer-type on-chip inductor structure further includes a conductive branch layer disposed in an insulating redistribution layer over the inter-metal dielectric (IMD) layer and electrically coupled to the first semi-circular stacking layer and the third semi-circular stacking layer. The first semi-circular stacking layer, the second semi-circular stacking layer, the first input/output conductive portion, the third semi-circular stacking layer, the fourth semi-circular stacking layer, and the second input/output conductive portion each includes an uppermost trace layer and a next uppermost trace layer vertically stacked under the uppermost trace layer and electrically coupled thereto.

In some embodiments, a multilayer-type on-chip inductor structure is provided. The multilayer-type on-chip inductor structure includes a first winding portion, including a first semi-circular stacking layer and a second semi-circular stacking layer arranged from inside to outside and in concentricity, and a first input/output conductive portion disposed on the outside of the second semi-circular stacking layer. The multilayer-type on-chip inductor structure also includes a second winding portion, including a third semi-circular stacking layer and a fourth semi-circular stacking layer arranged symmetrically with the first semi-circular stacking layer and the second semi-circular stacking layer, respectively, with respect to a symmetry axis, in which the first semi-circular stacking layer, the second semi-circular stacking layer, the first input/output conductive portion, the third semi-circular stacking layer, the fourth semi-circular stacking layer, and the second input/output conductive portion each includes a first trace layer disposed in an inter-metal dielectric (IMD) layer; a second trace layer disposed in the inter-metal dielectric (IMD) layer and vertically stacked over the first trace layer and electrically coupled thereto; and a third trace layer disposed in an insulating redistribution layer over the inter-metal dielectric (IMD) layer, vertically stacked over the second trace layer, and electrically coupled thereto. The multilayer-type on-chip inductor structure further includes a conductive branch layer disposed in the insulating redistribution layer and electrically coupled to the first semi-circular stacking layer and the third semi-circular stacking layer.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. In addition, the present disclosure may repeat reference numbers and/or letters in the various embodiments. This repetition is for the purpose of simplicity and clarity, and does not imply any relationship between the different embodiments and/or configurations discussed.

Figure 1:
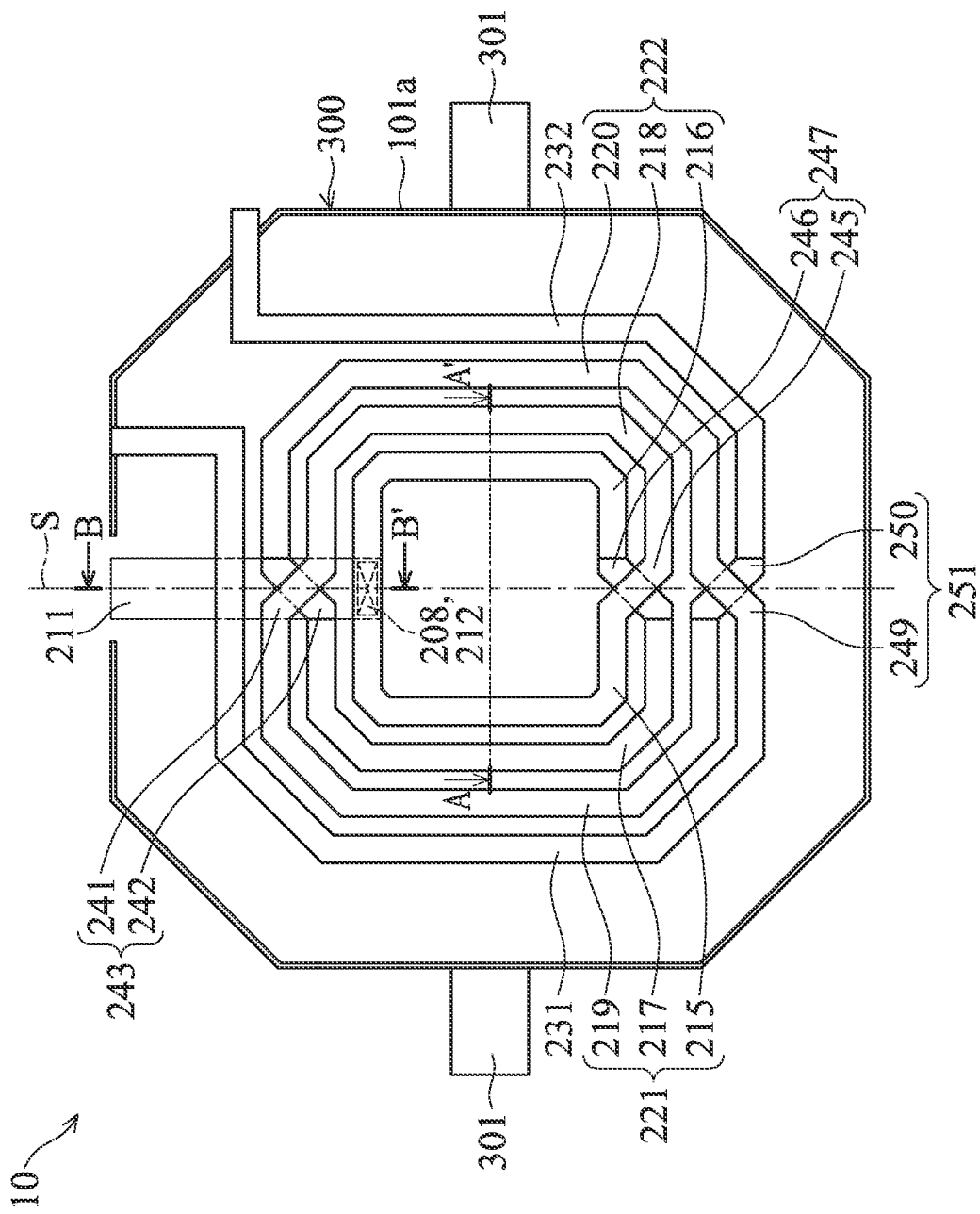
FIG. 1 is a plan view of a multilayer-type on-chip inductor structure in accordance with some embodiments.
Figure 2A:
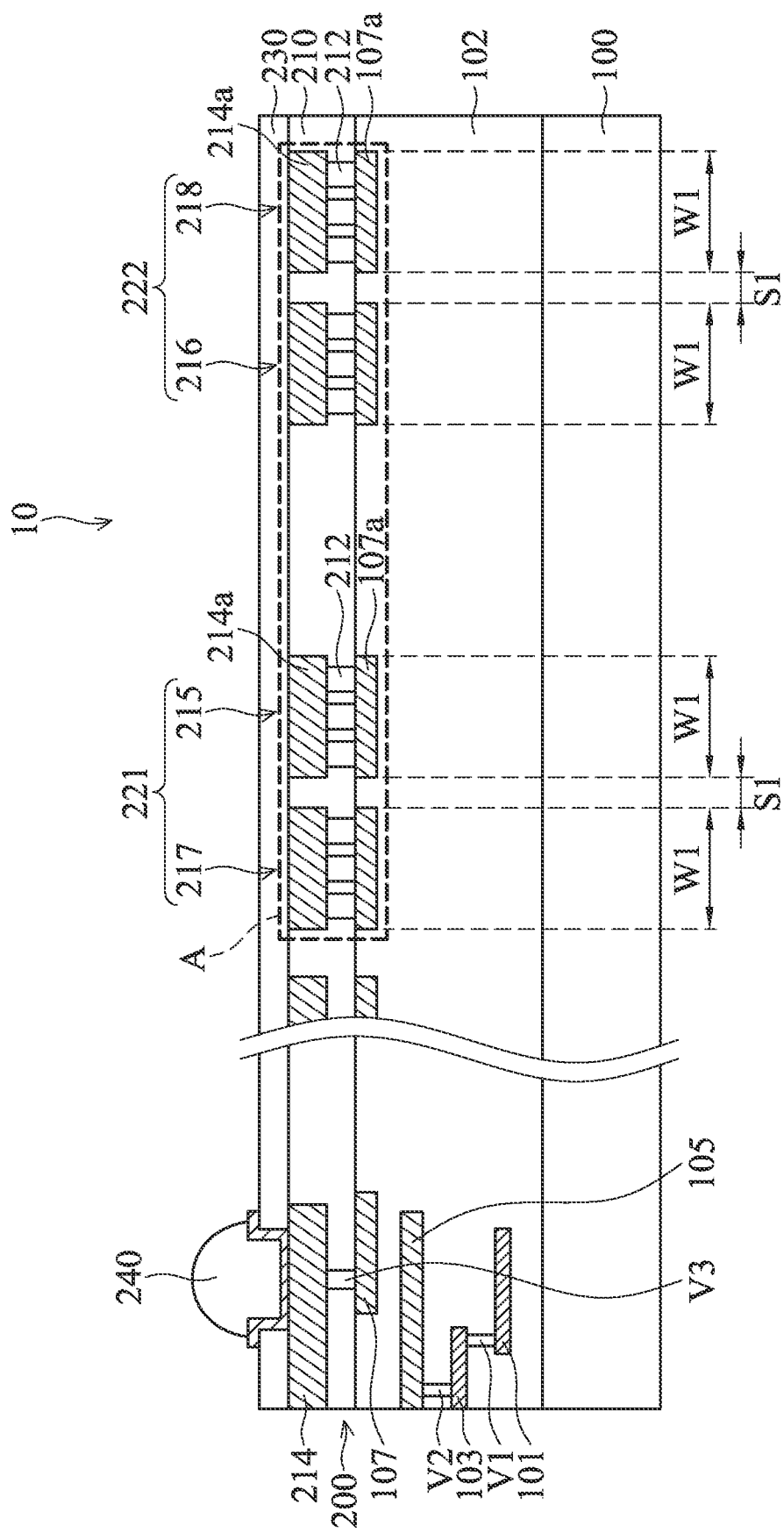
FIG. 2A shows a cross section of a semiconductor circuit with a multilayer-type on-chip inductor structure shown in FIG. 1 in accordance with some embodiments.
Figure 2B:
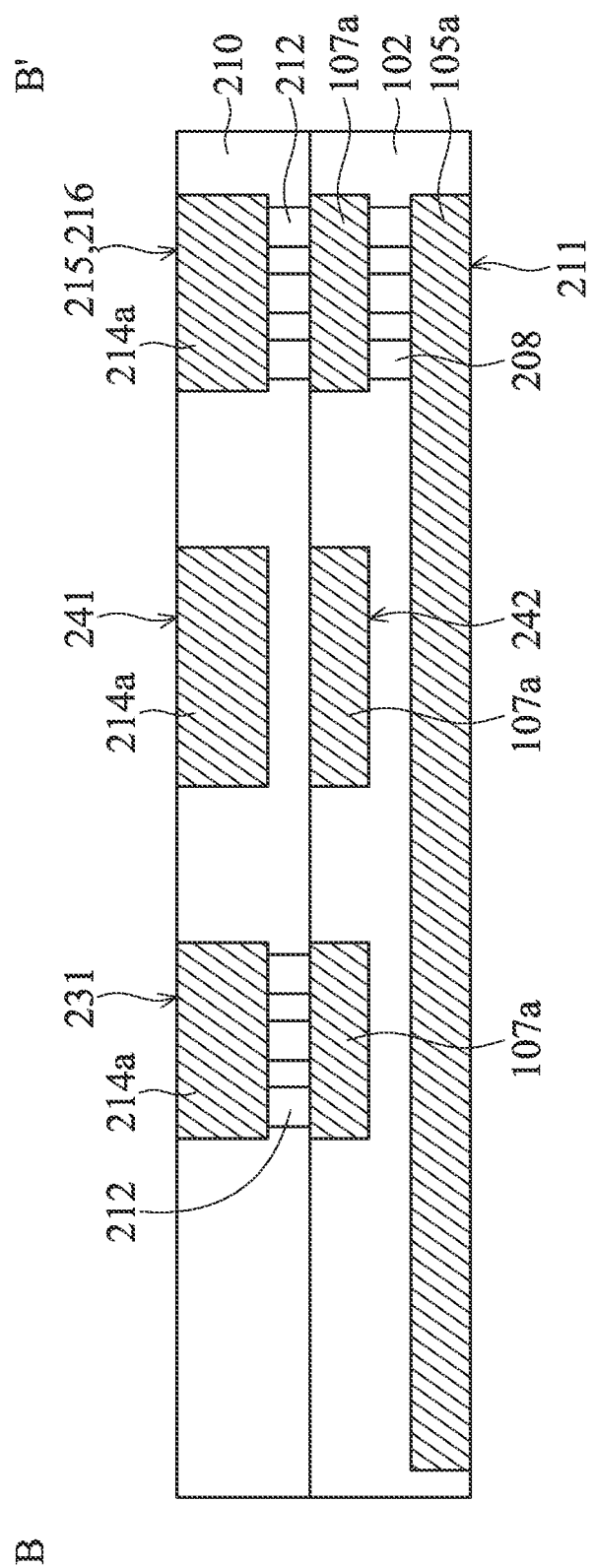
FIG. 2B shows a cross section of the multilayer-type on-chip inductor along the line B-B' in FIG. 1 according to some embodiments.

Refer to FIGS. 1 and 2A and 2B, in which FIG. 1 is a plan view of a multilayer-type on-chip inductor structure 10 in accordance with some embodiments, FIG. 2A shows a cross section of a semiconductor circuit with the multilayer-type on-chip inductor structure 10 shown in FIG. 1 according to some embodiments (in which the region A (indicated by a dashed line) is a cross section along line A-A' of FIG. 1), and FIG. 2B is a cross section the multilayer-type on-chip inductor structure 10 along line B-B' of in FIG. 1. In some embodiments, the semiconductor circuit includes a substrate 100, an inter-metal dielectric (IMD) layer 102 disposed on the substrate 100, an insulating redistribution layer 210 disposed on the inter-metal dielectric (IMD) layer 102, vertical and horizontal conductive features and the multilayer-type on-chip inductor structure 10 disposed in the inter-metal dielectric (IMD) layer 102 and the insulating redistribution layer 210, a passivation layer 230 covering the insulating redistribution layer 210, and a passivation layer 230 disposed on the insulating redistribution layer 210, and connectors 240 (for example, solder bumps or solder balls) disposed in the passivation layer 230, as shown in FIG. 2A.

In some embodiments, the substrate 100 includes a silicon substrate or other well-known semiconductor material substrate. The substrate 100 may contain a variety of different components, such as transistors, resistors, capacitors, and other well-known semiconductor components. Moreover, the substrate 100 may contain other conductive layers (e.g., copper, aluminum, or alloys thereof) and one or more insulating layers (e.g., a silicon oxide layer, a silicon nitride layer, or a low-k dielectric material layer). In order to simplify the diagram herein, a flat substrate is depicted only.

In some embodiments, the inter-metal dielectric (IMD) layer 102 is a single layer of dielectric material or a multi-layer dielectric structure. For example, the inter-metal dielectric (IMD) layer 102 may include multiple dielectric material layers that are alternately arranged with the horizontal conductive features (e.g., wiring layers 101, 103, 105, and 107) and formed over the substrate 100. In order to simplify the diagram herein, the inter-metal dielectric (IMD) layer 102 is depicted as a flat layer only. The wiring layers 101, 103, 105, and 107 are electrically coupled to each other by vertical conductive features (e.g., conductive plugs V1 and V2) and form an interconnect structure with the inter-metal dielectric layer 102, so as to be electrically coupled to the various elements formed in the substrate 100. In some embodiments, the inter-metal dielectric (IMD) layer 102 includes a silicon oxide layer, a silicon nitride layer, a low-k dielectric material layer, or other suitable dielectric material layer.

In some embodiments, the insulating redistribution layer 210 is a single layer of dielectric material or a multi-layer dielectric structure. For example, the insulating redistribution layer 210 may include a single layer of dielectric material having a redistribution layer 214 and at least one conductive plug V3 therein to form a redistribution structure 200. The connectors 240 are electrically coupled to the interconnect structure through the redistribution layer 214 and the conductive plug V3 in the insulating redistribution layer 210, such that the components in the substrate 100 are electrically coupled to the connectors 240. In some embodiments, the insulating redistribution layer 210 includes an inorganic dielectric layer (e.g., a silicon oxide layer, a silicon nitride layer, or a low-k dielectric material layer), an organic dielectric layer (e.g., polyimide (PI)), or another suitable dielectric material layer. In one embodiment, the thickness of redistribution layer 214 is greater than the thickness of wiring layers 101, 103, 105, and 107.

In some embodiments, the multilayer-type on-chip inductor structure 10 includes the inter-metal dielectric (IMD) layer 102, the insulating redistribution layer 210 disposed on the inter-metal dielectric (IMD) layer 102, and a first winding portion 221 and a second winding portion 222 disposed in the inter-metal dielectric (IMD) layer 102 and the insulating redistribution layer 210.

In some embodiments, the first winding portion 221 is located on a first side of the symmetry axis S, and the second winding portion 222 is located on a second side of the symmetry axis S, in which the first side and the second side are two opposite sides of the symmetry axis S. In some embodiments, the first winding portion 221 on the first side of the symmetry axis S includes at least two semi-circular stacking layers arranged from inside to outside and in concentricity, and an input/input portion 221 formed on the outside of these semi-circular stacking layers. Moreover, the second winding portion 222 formed on the second side of the symmetry axis S includes corresponding semi-circular stacking layers arranged from inside to outside and in concentricity.

For example, the first winding portion 221 includes a semi-circular stacking layer 215, a semi-circular stacking layer 217 and a semi-circular stacking layer 219 that are arranged from inside to outside and in concentricity, and an input/output conductive portion 231 that is disposed on the outside of the semi-circular stacking layer 219. The second winding portion 222 includes a semi-circular stacking layer 216, a semi-circular stacking layer 218 and a semi-circular stacking layers 220 that are arranged from inside to outside and in concentricity and are symmetrically arranged with the semi-circular stacking layer 215, the semi-circular stacking layer 217 and the semi-circular stacking layer 219 with respect to the symmetry axis S, and an input/output conductive portion 232 disposed on the outside of the semi-circular stacking layer 220. In some embodiments, the first winding portion 221 and the second winding portion 222 substantially form a circular, rectangular, hexagonal, octagonal, or polygonal shape. To simplify the diagram, only an exemplary octagonal shape is depicted.

In some embodiments, the semi-circular stacking layers 215 and 216, the semi-circular stacking layers 217 and 218, the semi-circular stacking layers 219 and 220, and the input/output conductive portions 231 and 232 are formed of the horizontal and vertical conductive features in inter-metal (IMD) dielectric layer 102 and the insulating redistribution layer 210. More specifically, the semi-circular stacking layers 215 and 216, the semi-circular stacking layers 217 and 218, the semi-circular stacking layers 219 and 220, and the input/output conductive portions 231 and 232 each have a trace layer 214a (i.e., the horizontal conductive feature in the insulating redistribution layer 210), a trace layer 107a (i.e., the horizontal conductive feature in the inter-metal dielectric (IMD) layer 102), and conductive plugs 212 disposed between the trace layer 214a and the trace layer 107a (i.e., the vertical conductive features in the insulating redistribution layer 210). In the semi-circular stacking layers 215 and 216, the semi-circular stacking layers 217 and 218, the semi-circular stacking layers 219 and 220, and the input/output conductive portions 231 and 232, the trace layer 214a is electrically coupled to the corresponding trace layer 107 (that is vertically stacked under the trace layer 214a) through the conductive plugs 212.

In some embodiments, the semi-circular stacking layers 215 and 216, the semi-circular stacking layers 217 and 218, the semi-circular stacking layers 219 and 220, and the input/output conductive portions 231 and 232 have the line widths W1 that are substantially the same as each other and the line space S1 that are substantially the same as each other. In some embodiments, the line width W1 is about 6 μm, and the line space S1 is about 2 μm. In those cases, the area defined by the first winding portion 221 and the second winding portion 222 is about 80.5×80.5 μm².

In some embodiments, the trace layer 214a is disposed in insulating redistribution layer 210, and is located at the same level in the insulating redistribution layer 210 as the redistribution layer 214. For example, the trace layer 214a and the redistribution layer 214 may be formed by defining the uppermost metal layer in the redistribution structure 200. Moreover, the trace layer 107a is disposed in the inter-metal dielectric (IMD) layer 102 and correspondingly formed under the trace layer 214a. The trace layer 107a and the wiring layer 107 are located at the same level in the inter-metal dielectric (IMD) layer 102. For example, the trace layer 107a and the wiring layer 107 may be formed by defining the uppermost metal layer (i.e., the uppermost horizontal conductive feature) in the interconnect structure. In some embodiments, the trace layers 107a and 214a, the wiring layer 107 and the redistributive layer 214 are made of metal, such as copper, aluminum, alloys thereof, or other suitable metal materials.

For general design rules, the thickness of redistribution layer 214 is greater than the uppermost metal layer (e.g., the wiring layer 107) in the interconnect structure. The uppermost metal layer (e.g., the wiring layer 107) in the interconnect structure is greater than or substantially equal to that of the underlying metal layers (e.g., the wiring layers 101, 103 and 105), depending on the various requirements. Therefore, the trace layer 214a formed by defining the uppermost metal layer in the redistribution structure 200 and the trace layer 107a formed by defining the uppermost metal layer in the interconnect structure can increase the cross section of the inductor significantly. Herein, the term "cross section" refers to an area of the semi-circular stacking layer perpendicular to the current direction in the inductor. As a result, the multilayer-type on-chip inductor structure 10 can reduce the conductor loss of the winding portion due to the thicker trace layer, compared to inductors formed by one or more metal layers in the interconnect structure, thus improving the quality factor (Q value) of the inductor. In particular, the thicker trace layer 214a increases the "cross section" of the inductor and improves the inductor performance.

In some embodiments, the multilayer-type on-chip inductor structure 10 further includes connecting layer pairs 243, 247, and 251 that are disposed between the first winding portion 221 and the second winding portion 222, so as to be electrically coupled between the first winding portion 221 and the second winding portion 222. In some embodiments, the connecting layer pair 243 includes an upper cross-connection layer 241 and a lower cross-connection layer 242. The upper cross-connection layer 241 connects the trace layer 214a of the semi-circular stacking layer 219 of the first winding portion 221 to the trace layer 214a of the semi-circular stacking layer 218 of the second winding portion 222. The lower cross-connection layer 242 connects the trace layer 107a of the semi-circular stacking layer 217 of the first winding portion 221 to the trace layer 107a of the semi-circular stacking layer 220 of the second winding portion 222. The connecting layer pair 247 includes an upper cross-connection layer 245 and a lower cross-connection layer 246. The upper cross-connection layer 245 connects the trace layer 214a of the semi-circular stacking layer 215 of the first winding portion 221 to the trace layer 214a of the semi-circular stacking layer 218 of the second winding portion 222. The lower cross-connection layer 246 connects the trace layer 107a of the semi-circular stacking layer 217 of the first winding portion 221 to the trace layer 107a of the semi-circular stacking layer 216 of the second winding portion 222. In addition, the connecting layer pair 251 includes an upper cross-connection layer 249 and a lower cross-connection layer 250. The upper cross-connection layer 249 connects the trace layer 214a of the input/output conductive portion 231 of the first winding portion 221 to the trace layer 214a of the semi-circular stacking layer 220 of the second winding portion 222. The lower cross-connection layer 250 connects the trace layer 107a of the semi-circular stacking layer 219 of the first winding portion 221 to the trace layer 107a of the input/output conductive portion 232 of the second winding portion 222.

In some embodiments, the upper cross-connection layers 241, 245 and 249 and the trace layer 214a are located at the same level in the insulating redistribution layer 210. That is, the upper cross-connection layers 241, 245 and 249 are formed by defining the uppermost metal layer in the redistribution structure 200. In some embodiments, the lower cross-connection layers 242, 246 and 250 are located below the upper cross-connection layers 241, 245 and 249, respectively, and are located at the same level in the inter-metal dielectric (IMD) layer 102 as the trace layer 107a. That is, the lower cross-connection layers 242, 246 and 250 are formed by defining the uppermost metal layer in the interconnect structure. In some embodiments, lower cross-connection layers 242, 246, and 250 and upper cross-connection layers 241, 245, and 249 are made of metal, such as copper, aluminum, alloys thereof, or other suitable metal materials.

In some embodiments, the multilayer-type on-chip inductor structure 10 further comprises a conductive branch layer 211 disposed in the inter-metal dielectric (IMD) layer 102, and electrically coupled to the semi-circular stacking layer 215 of the first winding portion 221 and the semi-circular stacking layer 216 of the second winding portion 222, as shown in FIGS. 1 and 2B. In some embodiments, the conductive branch layer 211 serves as a central tap. The central tap and the two input/output sections 231 and 232 in the first winding portion 221 and the second winding portion 222 together form an inductor device having three ends (e.g., a T-coil device).

The conductive branch layer 211 may be formed of a trace layer 105a in the inter-metal dielectric (IMD) layer 102 (i.e., a horizontal conductive feature in the inter-metal dielectric (IMD) layer 102). For example, the trace layer 105a is disposed in inter-metal dielectric (IMD) layer 102 and correspondingly formed on the symmetry axis S, and is electrically coupled to the semi-circular stacking layer 215 of the first winding portion 221 and the semi-circular stacking layer 216 of the second winding portion 222 through the conductive plugs 208. The conductive branch layer 211 and the wiring layer 105 are located at the same level in the inter-metal dielectric (IMD) layer. For example, the trace layer 105a and the wiring layer 105 may be formed by defining a next uppermost metal layer in the interconnect structure (i.e., the horizontal conductive feature located below and closest to the uppermost horizontal conductive feature). In some embodiments, the trace layer 105a and the wiring layer 105 are made of metal, for example, copper, aluminum, alloys thereof, or another suitable metal material. In some embodiments, the material of the trace layer 105a and the wiring layer 105 is the same as the material of the trace layer 107a and the wiring layer 107 and different than the material of the trace layer 214a and the redistribution layer 214. For example, the trace layer 105a, the wiring layer 105, the trace layer 107a, and the wiring layer 107 are made of copper, while the trace layer 214a and the redistribution layer 214 are made of aluminum. The different material choices are related to process cost and process limits (e.g., the line width).

In some embodiments, the inductive structure 10 further includes a guard ring 300 disposed in the inter-metal dielectric (IMD) layer 102 (not shown in FIGS. 2A and 2B). As viewed from a top-view perspective, the guard ring 300 surrounds the first winding portion 221 and the second winding portion 222. In some embodiments, the guard ring 300 is formed of a trace layer (i.e., a horizontal conductive feature in the inter-metal dielectric (IMD) layer 102) below the conductive branch layer 211. For example, the guard ring 300 is located at the same level as the wiring layer 101 in the inter-metal dielectric (IMD) layer 102. In some embodiments, the guard ring 300 is grounded or electrically coupled to a ground terminal in the substrate 100 via a conductive pad or electrode 301. Moreover, the material of the guard ring 300 is made of a metal, for example, copper, copper alloy, or another suitable metal material.

Figure 3:
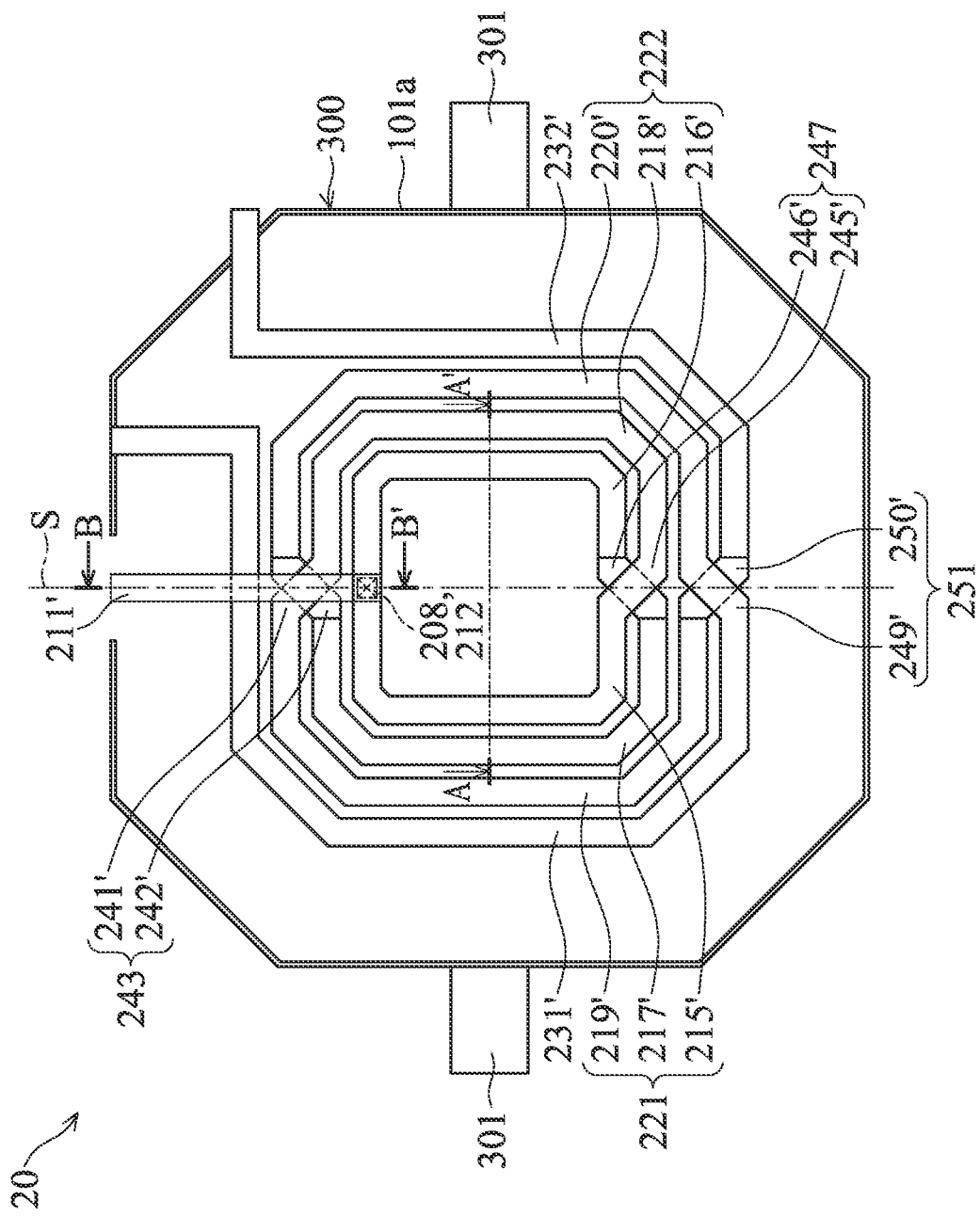
FIG. 3 is a plan view of a multilayer-type on-chip inductor structure in accordance with some embodiments.
Figure 4A:
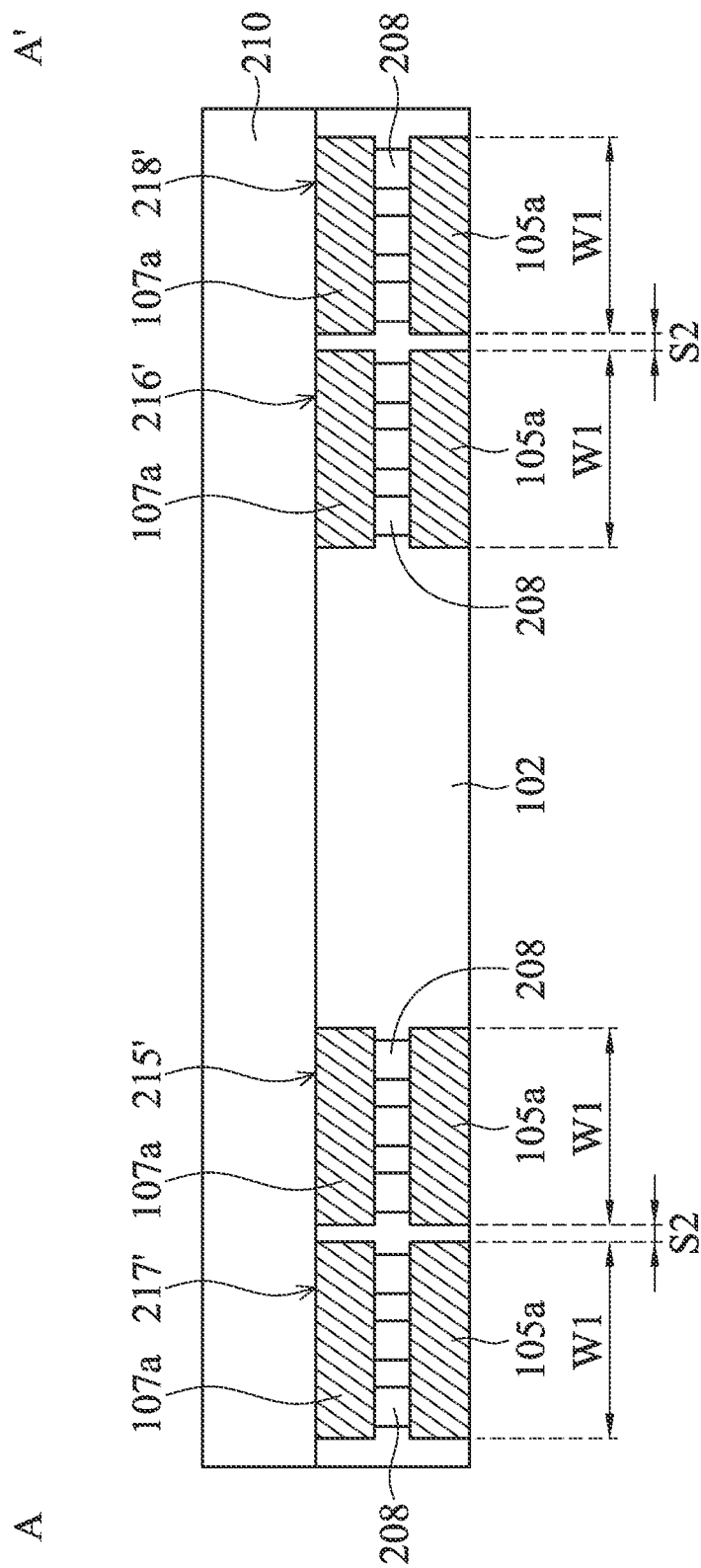
FIG. 4A shows a cross section of the multilayer-type on-chip inductor along the line A-A' in FIG. 3 according to some embodiments.
Figure 4B:
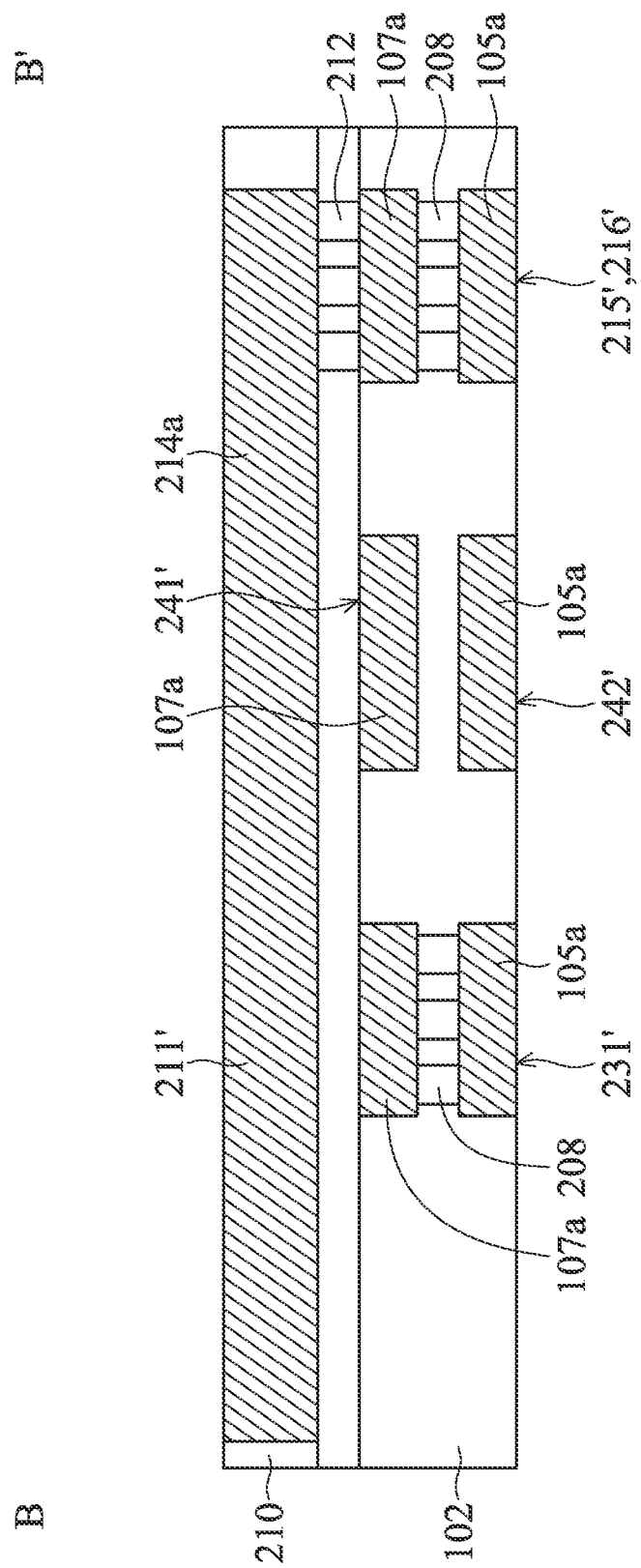
FIG. 4B shows a cross section of the multilayer-type on-chip inductor along the line B-B' in FIG. 3 according to some embodiments.

Refer to FIGS. 3, 4A and 4B, in which FIG. 3 illustrates a plan view of the multilayer-type on-chip inductor structure 20 according to some embodiments, FIG. 4A illustrates a cross-sectional view along line A-A' in FIG. 3 according to some embodiments, and FIG. 4B illustrates a cross-sectional view along line B-B' in FIG. 3 according to some embodiments. Elements in FIGS. 3, 4A and 4B that are the same as those in FIGS. 1, 2A and 2B are labeled with the same reference numbers as in FIGS. 1, 2A and 2B and are not described again. The multilayer-type on-chip inductor structure 20 has a structure similar to the multilayer-type on-chip inductor structure 10 in FIGS. 1, 2A and 2B.

However, unlike the multilayer-type on-chip inductor structure 10 shown in FIGS. 1, 2A and 2B, the first winding portion 221 in the multilayer-type on-chip inductor structure 20 includes a semi-circular stacking layer 215', a semi-circular stacking layer 217', and a semi-circular stacking layer 219' that are arranged from inside to outside and in concentricity, and an input/output conductive portion 231' disposed on the outside of semi-circular stacking layer 219'. The second winding portion 222 includes a semi-circular stacking layer 216', a semi-circular stacking layer 218' and a semi-circular stacking layer 220' that are arranged from inside to outside and in concentricity and are symmetrically arranged with the semi-circular stacking layer 215', the semi-circular stacking layer 217' and the semi-circular stacking layer 219' with respect to the symmetry axis S, and an input/output conductive portion 232' disposed on the outside of semi-circular stacking layer 220'. The semi-circular stacking layers 215' and 216', the semi-circular stacking layers 217' and 218', the semi-circular stacking layers 219' and 220', and the input/output conductive portions 231' and 232' each have a trace layer 105a (i.e., the horizontal conductive feature in the inter-metal dielectric (IMD) layer 102), and a trace layer 107a (i.e., the horizontal conductive feature in inter-metal dielectric (IMD) layer 102), and conductive plugs 208 (i.e., the vertical conductive features) disposed between the trace layer 105a and the trace layer 107a. The trace layer 107a is electrically coupled to the corresponding trace layer 105a (that is vertically stacked under the trace layer 107a) through the conductive plugs 208.

In some embodiments, the semi-circular stacking layer 215' and 216', the semi-circular stacking layer 217' and 218', the semi-circular stacking layer 219' and 220', the input/output conductive portion 231', and the input/output conductive portion 232' have substantially the same line width W1 and substantially the same line space S2. In some embodiments, the line width W1 is about 6 μm and the line space S2 is about 0.5 μm. Because portions of the winding portion of the multilayer-type on-chip inductor structure 10 shown in FIGS. 1, 2A and 2B are formed of the trace layer 214a in the insulating redistribution layer 210, a reserved line space S1 (about 2 μm) is wider than the line space S2 (about 0.5 μm) of the multilayer-type on-chip inductor structure 20. In addition, since the line space S2 of the multilayer-type on-chip inductor structure 20 is relatively narrow, the coupling between the semi-circular stacking layers of the multilayer-type on-chip inductor structure 20 can be increased, such that only a smaller area needs to be defined for the multilayer-type on-chip inductor structure 20 with an inductance value similar to that of the multilayer-type on-chip inductor structure 10. Therefore, in this case, the area of the multilayer-type on-chip inductor structure 20 defined by the first winding portion 221 and the second winding portion 222 is about 69×69 μm². In other words, the multilayer-type on-chip inductor structure 20 reduces the overall area of the inductor due to the reduction of the line space S2 (the area of the multilayer-type on-chip inductor structure 10 is about 80.5×80.5 μm²).

In some embodiments, the wiring layer 107a is located within the inter-metal dielectric (IMD) layer 102 and is located at the same level of the inter-metal dielectric (IMD) layer 102 as the wiring layer 107. For example, the trace layer 107a and the wiring layer 107 may be formed by defining the uppermost metal layer in the interconnect structure. Furthermore, the trace layer 105a is located in the inter-metal dielectric (IMD) layer 102 and is correspondingly formed below the trace layer 107a. The trace layer 105a and the wiring layer 105 are located in the inter-metal dielectric (IMD) layer 102. For example, the trace layer 105a and the wiring layer 105 can be formed by defining the next uppermost metal layer in the interconnect structure. In some embodiments, the trace layers 107a and 105a, the wiring layers 107 and 105a, and the wiring layers 107 and 105 can be formed by defining the next uppermost metal layer in the interconnect structure. In some embodiments, the wiring layers 107a and 105a, the wiring layers 107 and 105 may be made of metal, e.g., copper, copper alloy, or other suitable metal material.

However, the process capability of forming the redistribution layer 214 (or the trace layer 214a) is typically lower than that of forming the uppermost metal layer (e.g., the wiring layer 107 or the trace layer 107a) and next uppermost metal layer (e.g., the wiring layer 105 or the trace layer 105a). In other words, the process line minimum width of the redistribution layer 214 (or the trace layer 214a) is wider than the process line minimum width of the uppermost metal layer (the wiring layer 107 or the trace layer 107a)/next uppermost metal layer (e.g., the wiring layer 105 or the trace layer 105a). Therefore, using the trace layer 214a for the semi-circular stacking layer of the multilayer-type on-chip inductor structure, the line space between the semi-circular stacking layers is limited by the process limitation of the redistribution layer 214 and thus cannot be reduced. However, in the multilayer-type on-chip inductor structure 20, the trace layers 107a and 105a have the same process capability and higher than the process capability of the redistribution layer 214 (with narrower process line minimum width). Therefore, the line space (e.g., line space S2) between the semi-circular stacking layers of the multilayer-type on-chip inductor structure 20 can be reduced. As a result, the coupling between the semi-circular stacking layers of the multilayer-type on-chip inductor structure 20 can be increased, and the winding efficiency can be improved. Moreover, for the design flexibility and function density of the integrated circuit, it is advantageous to reduce the overall area of the multilayer-type on-chip inductor structure 20.

Similarly, in the multilayer-type on-chip inductor structure 20, the connecting layer pair 243 includes an upper cross-connection layer 241' and a lower cross-connection layer 242'. The upper cross-connection layer 241' connects the trace layer 107a of the semi-circular stacking layer 219' of the first winding portion 221 to the trace layer 107a of the semi-circular stacking layer 218' of the second winding portion 222. The lower cross-connection layer 242' connects the trace layer 105a of the semi-circular stacking layer 217' of first winding portion 221 to the trace layer 105a of the semi-circular stacking layer 220' of the second winding portion 222. Moreover, the connecting layer pair 247 includes an upper cross-connection layer 245' and a lower cross-connection layer 246'. The upper cross-connection layer 245' connects the trace layer 107a of the semi-circular stacking layer 215' of the first winding portion 221 to the trace layer 107a of the semi-circular stacking layer 218' of the second winding portion 222. The lower cross-connection layer 246' connects the trace layer 105a of the semi-circular stacking layer 217' of the first winding portion 221 to the trace layer 105a of the semi-circular stacking layer 216' of the second winding portion 222. In addition, the connecting layer pair 251 includes an upper cross-connection layer 249' and a lower cross-connection layer 250'. The upper cross-connection layer 249' connects the trace layer 107a of the semi-circular stacking layer 220' of the second winding portion 222 to the trace layer 107a of the semi-circular stacking layer 219' of the first winding portion 221. The lower cross-connection layer 250' connects the trace layer 105a of the semi-circular stacking layer 219' of the first winding portion 221 to the trace layer 105a of the input/output conductive portion 232' of the second winding portion 222.

In some embodiments, the upper cross-connection layers 241', 245' and 249' and the trace layer 107a are disposed at the same level in the inter-metal dielectric (IMD) layer 102.

That is, the upper cross-connection layers 241', 245' and 249' can be formed by defining the uppermost metal layer in the interconnect structure. Moreover, the lower cross-connection layers 242', 246' and 250' are disposed below the upper cross-connection layers 241', 245' and 249', respectively, and are located at the same level as trace layer 105a in the inter-metal dielectric (IMD) layer 102. That is, the lower cross-connection layers 242', 246' and 250' can be formed by defining the next uppermost metal layer in the interconnect structure. In some embodiments, lower cross-connection layers 242', 246', and 250' and upper cross-connection layers 241', 245', and 249' are made of metal, for example, copper, copper alloy or another suitable metal material.

Similarly, the multilayer-type on-chip inductor structure 20 further includes a conductive branch layer 211'. Unlike the conductive branch layer 211 of the multilayer-type on-chip inductor structure 10, the conductive branch layer 211' is disposed in the insulating redistribution layer 210 and electrically coupled to the semi-circular stacking layer 215' of the first winding portion 221 and the semi-circular stacking layer 216' of the second winding portion 222, as shown in FIGS. 3 and 4B. In some embodiments, the conductive branch layer 211' is formed of the trace layer 214a (i.e., the horizontal conductive feature in the insulating redistribution layer 210). For example, the trace layer 214a is located in insulating redistribution layer 210 and correspondingly formed on the symmetry axis S, and is electrically coupled to the semi-circular stacking layer 215' of the first winding portion 221 and the semi-circular stacking layer 216' of the second winding portion 222 by conductive plugs 212. The conductive branch layer 211' and the redistribution layer 214 are located at the same level in the insulating redistribution layer 210. In some embodiments, the trace layer 214a is made of metal, such as aluminum, aluminum alloy, or other suitable metal materials.

Since the conductive branch layer 211' is formed of the trace layer 214a (with a thickness greater than that of the trace layers 107a and 105a), the cross section of the conductive branch layer 211' is greater than that of the conductive branch layer 211 of the multi-layer chip built-in inductor structure 10, so that the DC resistance (DC-R) of the conductive branch layer 211' is less than the DC resistance of the conductive branch layer 211. As a result, by using the thicker trace layer 214a as the center tap (i.e., the conductive branch layer 211'), the width of the electrical branch layer 211' can be reduced without affecting the DC resistance of the conductive branch layer 211'. The width of the branch layer 211' can be reduced without affecting the DC resistance of the conductive branch layer 211'. As a result, the parasitic coupling between the central tap and the first and second winding portions 221 and 222, and the parasitic coupling between the central tap and the substrate 100 (shown in FIG. 2A) can be reduced.

Figure 5:
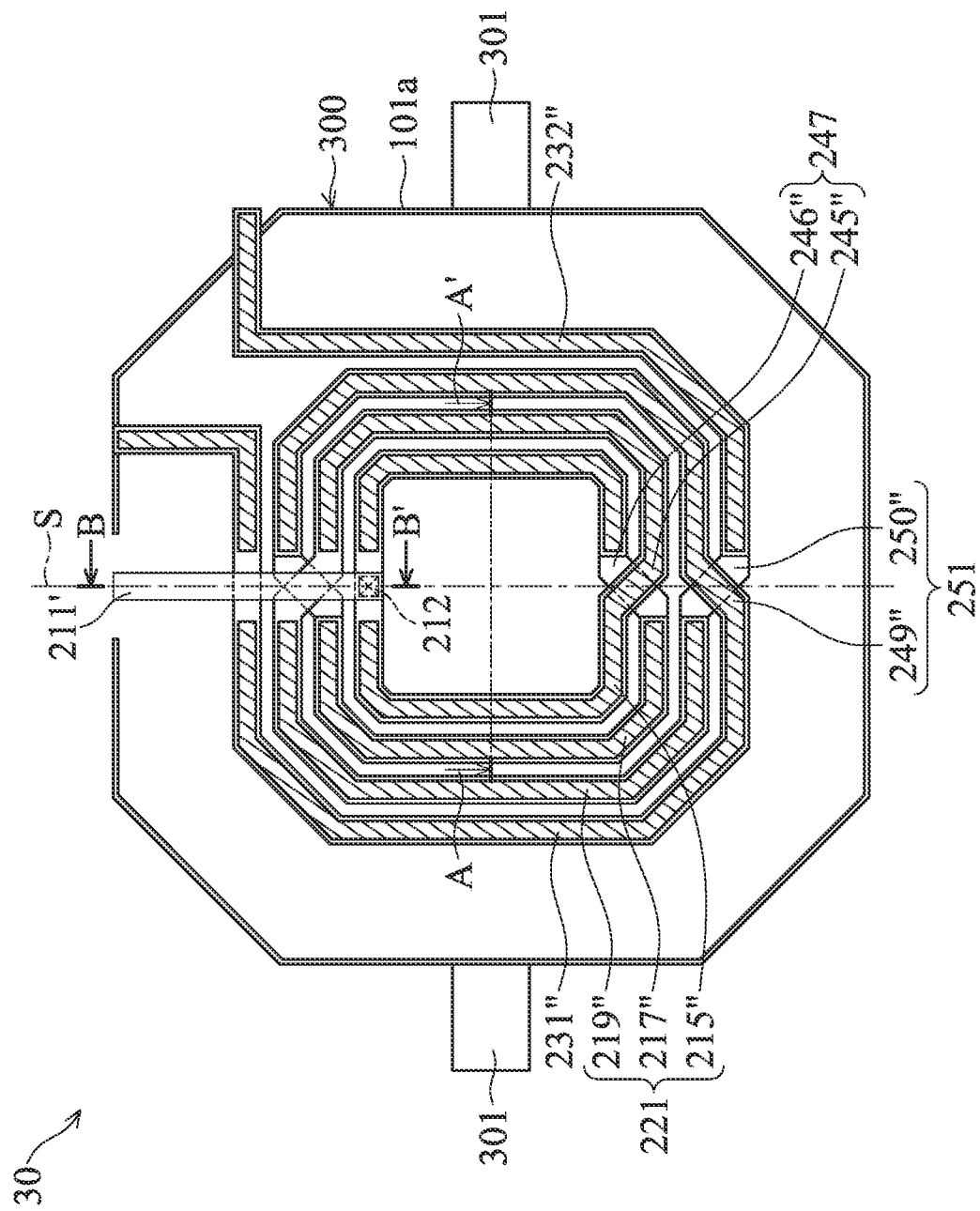
FIG. 5 is a plan view of a multilayer-type on-chip inductor structure in accordance with some embodiments.
Figure 6:
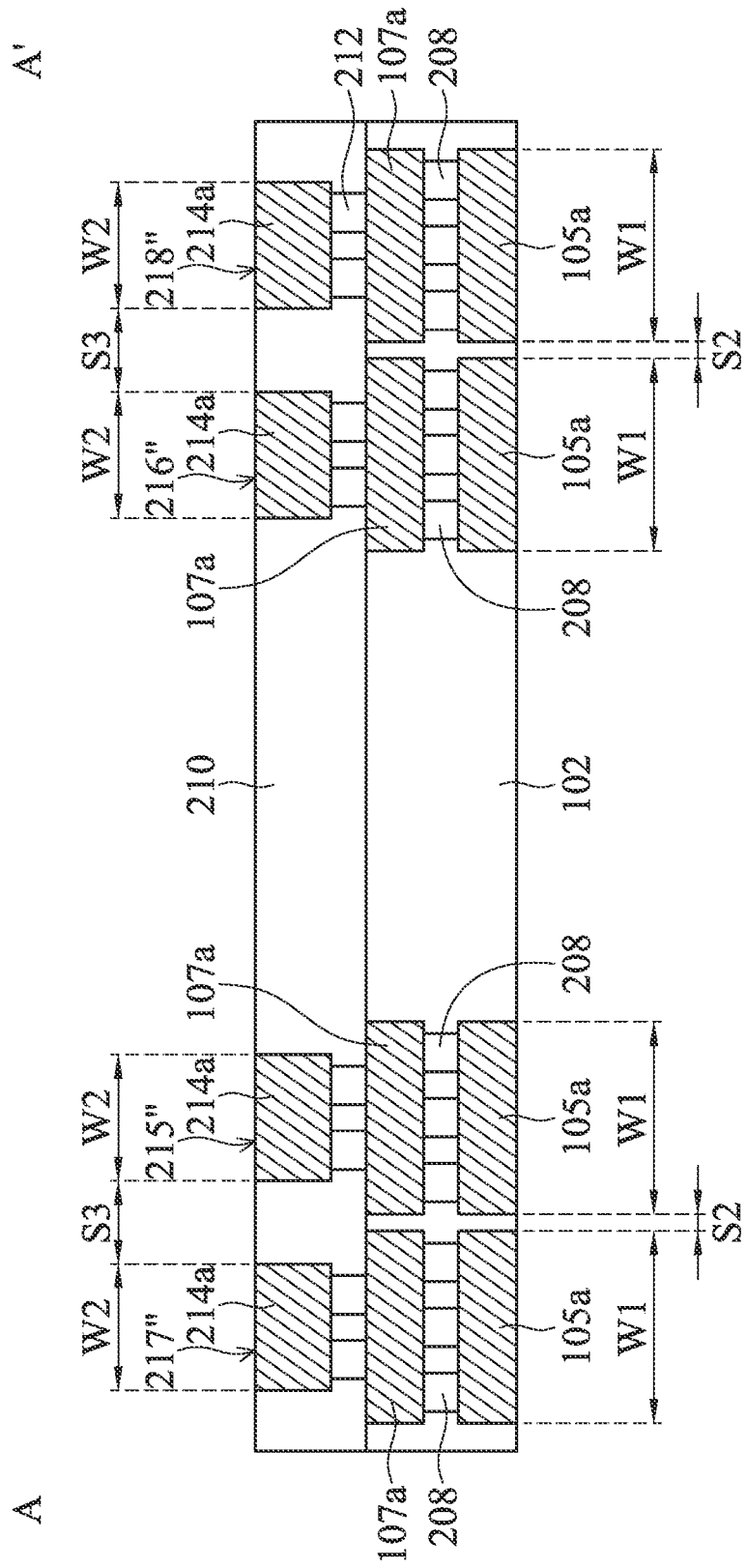
FIG. 6 shows a cross section of the multilayer-type on-chip inductor along the line A-A' in FIG. 5 according to some embodiments.

Refer to FIGS. 5 and 6, in which FIG. 5 illustrates a plan view of the multilayer-type on-chip inductor structure 30 according to some embodiments, and FIG. 6 illustrates a cross-sectional view along line A-A' in FIG. 5 according to some embodiments. Elements in FIGS. 5 and 6 that are the same as those in FIGS. 3 and 4A are labeled with the same reference numbers as in FIGS. 3 and 4A and are not described again. The multilayer-type on-chip inductor structure 30 has a structure similar to the multilayer-type on-chip inductor structure 20 in FIGS. 3 and 4A.

However, unlike the multilayer-type on-chip inductor structure 20 in FIGS. 3 and 4A, the first winding portion 221 in the multilayer-type on-chip inductor structure 30 includes a semi-circular stacking layer 215", a semi-circular stacking layer 217", and a semi-circular stacking layer 219" that are arranged from inside to outside and in concentricity, and an input/output conductive portion 231" disposed on the outside of semi-circular stacking layer 219". The second winding portion 222 includes a semi-circular stacking layer 216", a semi-circular stacking layer 218" and a semi-circular stacking layer 220" that are arranged from inside to outside and in concentricity and are symmetrically arranged with the semi-circular stacking layer 215", the semi-circular stacking layer 217" and the semi-circular stacking layer 219" with respect to the symmetry axis S, and an input/output conductive portion 232" disposed on the outside of semi-circular stacking layer 220". The semi-circular stacking layers 215" and 216", the semi-circular stacking layers 217" and 218", the semi-circular stacking layers 219" and 220", and the input/output conductive portions 231" and 232" each having a trace layer 105$a$ (i.e., the horizontal conductive feature in inter-metal dielectric (IMD) layer 102), a trace layer 107$a$ (i.e., the horizontal conductive feature in the inter-metal dielectric (IMD) layer 102), a trace layer 214$a$ (i.e., the horizontal conductive feature in the insulating redistribution layer 210), conductive plugs 212 disposed between the trace layer 214$a$ and the trace layer 107$a$ (i.e., the vertical conductive feature in the insulating redistribution layer 210). The trace layer 214$a$ is electrically coupled to the corresponding trace layer 107$a$ (that is vertically stacked below the trace layer 214$a$) through the conductive plugs 212, and the trace layer 107$a$ is electrically coupled to the corresponding trace layer 105$a$ (that is vertically stacked below the trace layer 107$a$) through the conductive plugs 208.

In some embodiments, the trace layers 107$a$ and the trace layers 105$a$ have substantially the same line width W1 and substantially the same line space S2 between adjacent trace layers 107$a$ and between adjacent trace layers 105$a$. Moreover, the trace layer 214$a$ has a line width W2 (which is less than the line width W1 of trace layers 107$a$ and the trace layer 105$a$), and a line space S3 between the adjacent trace layer 214$a$ is greater than the line space S2. In those cases, the area defined by the first winding portion 221 and the second winding portion 222 is about 69×69 µm$^2$. In other words, the multilayer-type on-chip inductor structure 30 is similar to the multilayer-type on-chip inductor structure 20, which reduces the overall area of the inductor. Furthermore, since the first winding portion 221 and the second winding portion 222 are each formed of three stacked metal layers (e.g., the trace layers 105$a$, 107$a$, and 214$a$), the cross section of semi-circular stacking layer can be increased further. As a result, the conductor loss of the winding portion can be reduced to improve the quality factor of the inductor, thereby enhancing the inductor performance.

According to the foregoing embodiments of the multilayer-type on-chip inductor structures, since the uppermost metal layer of the redistribution structure is used as the conductive branch layer of the inductor (i.e., the center tap of the inductor with a T-coil), the uppermost metal layer and the next uppermost metal layer in the inter-metal dielectric (IMD) layer can be used as the winding portion of the inductor. Therefore, the process capability for forming the winding portion can be effectively improved. As a result, the coupling between the adjacent trace layers can be increased by reducing the line space between them, thereby improving the efficiency of inductor winding. Moreover, using the thicker uppermost metal layer of the redistribution structure as the conductive branch layer of the inductor can also reduce the width of the conductive branch layer, thereby reducing the undesired parasitic coupling in the inductor.

According to the foregoing embodiments of the multilayer-type on-chip inductor, since the line space between the adjacent trace layers is reduced, the overall area of the inductor can be reduced, thereby enhancing the design flexibility and function density of the integrated circuit.

According to the foregoing embodiments of the multilayer-type on-chip inductor, since the uppermost metal layer of the redistribution structure and the uppermost metal layer and the next uppermost metal layer in the inter-metal dielectric (IMD) layer can be used as the winding portions of the inductor, the cross section of the semi-circular stacking layer in the inductor can be increased, thereby improving the quality factor of inductor. In addition, since the multilayer-type on-chip inductor structure can be formed during the fabrication of the interconnect structure and the redistribution structure, there is no need to use additional metal layers and additional processes to fabricate the multilayer-type on-chip inductor structure. As a result, the manufacturing cost is not increased.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A multilayer-type on-chip inductor structure, comprising:
    a first winding portion disposed in an inter-metal dielectric (IMD) layer and including a first semi-circular stacking layer and a second semi-circular stacking layer arranged from inside to outside and in concentricity, and a first input/output conductive portion disposed on the outside of the second semi-circular stacking layer;
    a second winding portion, disposed in the IMD layer and including a third semi-circular stacking layer and a fourth semi-circular stacking layer arranged symmetrically with the first semi-circular stacking layer and the second semi-circular stacking layer, respectively, with respect to a symmetry axis, and a second input/output conductive portion disposed on the outside of the fourth semi-circular stacking layer;
    a conductive branch layer disposed in an insulating redistribution layer over the IMD layer and electrically coupled to the first semi-circular stacking layer and the third semi-circular stacking layer,
    wherein the first semi-circular stacking layer, the second semi-circular stacking layer, the first input/output conductive portion, the third semi-circular stacking layer, the fourth semi-circular stacking layer, and the second input/output conductive portion each comprises:
    an uppermost trace layer; and
    a next uppermost trace layer vertically stacked under the uppermost trace layer and electrically coupled thereto.
2. The structure as claimed in claim 1, further comprising:
    a plurality of conductive plugs disposed between the uppermost trace layer and the next uppermost trace layer, so that the uppermost trace layer is electrically coupled to the next uppermost trace layer.
3. The structure as claimed in claim 1, wherein a line width of the uppermost trace layer is substantially equal to a line width of the next uppermost trace layer.

4. The structure as claimed in claim 1, wherein a thickness of the uppermost trace layer is substantially equal to a thickness of the next uppermost trace layer.

5. The structure as claimed in claim 1, wherein a thickness of the conductive branch layer is greater than a thickness of the uppermost trace layer and a thickness of the next uppermost trace layer.

6. The structure as claimed in claim 1, further comprising:
a first connecting layer pair disposed between the first winding portion and the second winding portion, comprising:
an upper cross-connection layer connecting the uppermost trace layer of the first semi-circular stacking layer to the uppermost trace layer of the fourth semi-circular stacking layer; and
a lower cross-connection layer connecting the next uppermost trace layer of the second semi-circular stacking layer to the next uppermost trace layer of the third semi-circular stacking layer.

7. The structure as claimed in claim 1, wherein the first winding portion further comprises a fifth semi-circular stacking layer disposed between the second semi-circular stacking layer and the first input/output conductive portion, and the second winding portion further comprises a sixth semi-circular stacking layer disposed between the fourth semi-circular stacking layer and the second input/output conductive portion, and wherein the fifth semi-circular stacking layer and the sixth semi-circular stacking layer each comprise the uppermost trace layer and the next uppermost trace layer.

8. The structure as claimed in claim 7, further comprising:
a second connecting layer pair disposed between the first winding portion and the second winding portion, comprising:
an upper cross-connection layer connecting the uppermost trace layer of the fifth semi-circular stacking layer to the uppermost trace layer of the fourth semi-circular stacking layer; and
a lower cross-connection layer connecting the next uppermost trace layer of the second semi-circular stacking layer to the next uppermost trace layer of the sixth semi-circular stacking layer; and
a third connecting layer pair disposed between the first winding portion and the second winding portion, comprising:
an upper cross-connection layer connecting the uppermost trace layer of the first input/output conductive portion to the uppermost trace layer of the sixth semi-circular stacking layer; and
a lower cross-connection layer connecting the next uppermost trace layer of the fifth semi-circular stacking layer to the next uppermost trace layer of the second input/output conductive portion.

9. The structure as claimed in claim 1, wherein the uppermost trace layer and the next uppermost trace layer are made of the same metal material.

10. The structure as claimed in claim 9, wherein the conductive branch layer and the uppermost trace layer are made of different metal materials.

* * * * *